United States Patent [19]

Hasegawa

[11] Patent Number: 5,313,085
[45] Date of Patent: May 17, 1994

[54] SEMICONDUCTOR INTEGRATED CIRCUIT DEVICE

[75] Inventor: Koichi Hasegawa, Itami, Japan

[73] Assignee: Mitsubishi Denki Kabushiki Kaisha, Tokyo, Japan

[21] Appl. No.: 894,299

[22] Filed: Jun. 4, 1992

[30] Foreign Application Priority Data

Jun. 4, 1991 [JP] Japan .................................. 3-132659
Jan. 28, 1992 [JP] Japan .................................. 4-012876

[51] Int. Cl.$^5$ ........................ H01L 27/02; H03K 3/01
[52] U.S. Cl. ................................. 257/370; 307/296.1; 307/296.7; 307/570
[58] Field of Search ..................... 257/370; 307/296.1, 307/296.7, 570

[56] References Cited

U.S. PATENT DOCUMENTS 5,149,988 9/1992 Smith et al. ........................... 307/570

Primary Examiner—Edward Wojciechowicz
Attorney, Agent, or Firm—Oblon, Spivak, McClelland, Maier & Neustadt

[57] ABSTRACT

A voltage reduction circuit is electrically inserted between a first power supply pad and a power source voltage supplying portion of a bipolar circuit part. Receiving a control signal from a CMOS circuit part, the voltage reduction circuit reduces a power source voltage given thereto via the power supply pad, thereby producing a reduced power source voltage and outputting the reduced power source voltage to the power source voltage supplying portion of the bipolar circuit part. Hence, even though the same power source voltage is commonly supplied to the power supply pads of the bipolar circuit part and the CMOS circuit part via the same external power source pin, one of the bipolar circuit part and the CMOS circuit part receives the reduced power source voltage from the voltage reduction circuit. Thus, it is possible that a power source voltage to the CMOS circuit part and a power source voltage to the bipolar circuit part are different without increasing the number of external power source pins.

14 Claims, 6 Drawing Sheets

SEMICONDUCTOR INTEGRATED CIRCUIT DEVICE

BACKGROUND OF THE INVENTION

1. Field of the Invention

The present invention relates to a Bi-CMOS semiconductor device.

2. Description of the Background Art

FIG. 1 is an explanatory diagram of a conventional Bi-CMOS semiconductor integrated circuit device. In the conventional Bi-CMOS semiconductor device, a CMOS circuit part 2 and a bipolar circuit part 3 are mounted in a separated relation on the same semiconductor chip 1. A power source voltage supply VC of the CMOS circuit part 2 is connected through a power supply line 5 to a power supply pad 7 which is also mounted on the semiconductor chip 1. Likewise, a power source voltage supply VC of the bipolar circuit part 3 is connected through a power supply line 4 to a power supply pad 6 mounted on the semiconductor chip 1. The power supply pads 6 and 7 are commonly connected to an external power source voltage pin 10, the pad 6 being connected via a wire 8 and the pad 7 being connected via a wire 9.

This structure allows a power source voltage from the external power source voltage pin 10 to be impressed on the power supply pads 6 and 7 through the wires 8 and 9, respectively. The power source voltage thus allowed to the power supply pads 6 and 7 is then supplied to the power source voltage supplies VC of the CMOS circuit part 2 and the bipolar circuit part 3 through the power supply lines 4 and 5, respectively. In other words, the power source voltage allowed from the external power source voltage pin 10 is commonly given to the CMOS circuit part 2 and the bipolar circuit part 3 under same conditions as power source voltages for the respective circuit parts.

As heretofore described, the conventional Bi-CMOS semiconductor device as above usually comprises only one external power source voltage pin, i.e., the pin 10, for ensuring voltage to the CMOS circuit part 2 and the bipolar circuit part 3. Hence, it is a general practice that the same power source voltage from the external power source voltage pin 10 is supplied commonly to the power source voltage supplies VC of the CMOS circuit part 2 and the bipolar circuit part 3.

The bipolar circuit part 3 consumes a relatively large power source voltage. Aiming at reducing a voltage consumed at the bipolar circuit part 3, therefore, a need often arises that the bipolar circuit part 3 is driven at a lower power source voltage than a power source voltage for the CMOS circuit part 2.

Different power source voltages to the CMOS circuit part 2 and the bipolar circuit part 3 are required not only for the above purpose but also for the purpose of efficiently inspecting a semiconductor device in a burn-in test. For example, even in a semiconductor device in which both the CMOS circuit part 2 and the bipolar circuit part 3 are driven usually at 5 volts, a 7-volt power source voltage is desired for the CMOS circuit part 2. On the other hand, a voltage to the bipolar circuit part 3 is desirably around 5 volts since a 7-volt voltage often destroys the bipolar circuit part 3.

The former need cannot be satisfied in the conventional Bi-CMOS semiconductor device because its structure does not allow that the CMOS circuit part 2 and the bipolar circuit part 3 are driven by different power source voltages at the same time. As to the latter need related to a burn-in test, only one solution opens; that is, to keep the CMOS circuit part 2 inactivated while testing the bipolar circuit part 3 or vice versa. However, this approach is labor- and time-consuming.

The difficulty as above related to a burn-in test is solved by using an external power source voltage pin for each one of the CMOS circuit part 2 and the bipolar circuit part 3. However, employing a plurality of external power source voltage pins increases the number of external terminals required in the semiconductor device accordingly, thereby degrading the integration of the device. Hence, this is not a practical approach, either.

SUMMARY OF THE INVENTION

In a first aspect of the present invention, a semiconductor integrated circuit device comprises: a semiconductor chip; a CMOS circuit part formed by CMOS elements which are provided on the semiconductor chip, the CMOS circuit part including a control signal generation part for outputting a control signal in response to a data signal supplied thereto; a bipolar circuit part formed by bipolar elements which are provided on the semiconductor chip; an external power source terminal for receiving a predetermined power source voltage; a first power supply pad mounted on the semiconductor chip, the first power supply pad being electrically interposed between a power source voltage supplying portion of the CMOS circuit part and the external power source terminal; a second power supply pad mounted on the semiconductor chip, the second power supply pad being electrically interposed between a power source voltage supplying portion of the bipolar circuit part and the external power source terminal; and at least one voltage reduction circuit being inserted at least between the first power supply pad and the power source voltage supplying portion of the CMOS circuit part or between the second power supply pad and the power source voltage supplying portion of the bipolar circuit part, the at least one voltage reduction circuit reducing the power source voltage in accordance with the control signal thereby to obtain a reduced power source voltage and outputting the reduced power source voltage to the power source voltage supplying portion of the CMOS and/or bipolar circuit part to which the at least one voltage reduction circuit is connected.

In a preferred embodiment of the first aspect of the present invention, the device has the following features. In response to the control signal, the voltage reduction circuit reduces the power source voltage by a predetermined amount or does not reduce the power source voltage at all, thereby to produce the reduced power source voltage.

In another preferred embodiment of the first aspect of the present invention, the device has the following features. In response to the control signal, the voltage reduction circuit reduces the power source voltage by predetermined amounts so that resulting voltages have varying potential levels and one of the resulting voltages of varying potential levels is selected as the reduced power source voltage.

In a preferred embodiment of the third aspect of the present invention, the device has the following features. The control signal generation part of the CMOS circuit part further includes: a shift register driven by a clock signal and the data signal, the shift register shifting the data signal one after another in synchronism with the clock signal received thereto, whereby the data signal is stored in the shift register as stored data; a pulse counter, the pulse counter counting pulses of the clock signal and outputting an active count output signal only when the pulses of the clock signal has been counted for predetermined times; and a latch driven by the count output signal in accordance with the stored data of the shift register, the latch latching the stored data as latch data when the count output signal is active and outputting a portion of the latch data as the control signal.

Further, a remaining portion of the latch except for the portion is preferably outputted as the control signal is used within the CMOS circuit part.

In another preferred embodiment of the third aspect of the present invention, the device has the following features. The control signal generation part of the CMOS circuit part further includes: a shift register driven by a clock signal and the data signal, the shift register shifting the data signal one after another in synchronism with the clock signal received thereto, whereby the data signal is stored in the shift register as stored data; a pulse counter, the pulse counter counting pulses of the clock signal and outputting an active count output signal only when the pulses of the clock signal has been counted for predetermined times; a latch selector driven by the count output signal in accordance with first data and second data, the first and the second data each being a portion of the stored data of the shift register, the latch selector latching the first and the second data as latch data when the count output signal is active and outputting the first data as the control signal while outputting a plurality of latch selection signals in accordance with the second data, the plurality of latch selection signals including an active latch selection signal and an inactive latch selection signal; and a plurality of latches each receiving a portion of the remaining portion of the stored data and either one of the active latch selection signal and the inactive latch selection signal, the plurality of latches each latching the portion of the stored data received therein as latch data when receiving the active latch selection signal.

Preferably, the latch data in each one of the plurality of latches is used within the CMOS circuit part.

Preferably, the voltage reduction circuit further includes: voltage reduction means for reducing the power source voltage and outputting a low level power source voltage; and output voltage selection means, the output voltage selection means, in response to the control signal, outputting either one of the power source voltage and the low level power source voltage as the reduced power source voltage.

Preferably, the voltage reduction means includes a plurality of resistors which are provided in series between a power source and a ground, and the plurality of resistors divide the power source voltage, whereby the low level power source is produced and outputted.

Preferably, the voltage reduction means further includes a transistor which turns off in response to the control signal received at a gate thereof, thereby the low level power source voltage being prevented from being outputted.

Preferably, the voltage reduction means causing voltage drop at a diode provided between the power source and the ground and reducing the power source voltage, thereby producing and outputting the low level power source voltage.

Preferably, the voltage reduction means causing voltage drop at a transistor provided between the power source and the ground and reducing the power source voltage, thereby producing and outputting the low level power source voltage.

In a second aspect of the present invention, a semiconductor integrated circuit device, comprises: a semiconductor chip; a CMOS circuit part formed by CMOS elements which are provided on the semiconductor chip, the CMOS circuit part including a control signal generation part for outputting a control signal in response to a data signal supplied thereto; a bipolar circuit part formed by bipolar elements which are provided on the semiconductor chip; an external power source terminal for receiving a predetermined power source voltage; a first power supply pad mounted on the semiconductor chip, the first power supply pad being electrically connected to the external power source terminal; a voltage reduction circuit mounted on the semiconductor chip, the voltage reduction circuit being electrically inserted between the first power supply pad and a power source voltage supplying portion of the bipolar circuit part, the voltage reduction circuit reducing the power source voltage in accordance with the control signal thereby to obtain a reduced power source voltage and outputting the reduced power source voltage to the power source voltage supplying portion of the bipolar circuit part; and a second power supply pad mounted on the semiconductor chip, the second power supply pad being electrically inserted between a power source voltage supplying portion of the CMOS circuit part and the external power source terminal.

In a third aspect of the present invention, a semiconductor integrated circuit device, comprises: a semiconductor chip; a CMOS circuit part formed by CMOS elements which are provided on the semiconductor chip, the CMOS circuit part including a control signal generation part for outputting a control signal in response to a data signal supplied thereto; a bipolar circuit part formed by bipolar elements which are provided on the semiconductor chip; an external power source terminal for receiving a predetermined power source voltage; a first power supply pad mounted on the semiconductor chip, the first power supply pad being electrically connected to the external power source terminal; a voltage reduction circuit mounted on the semiconductor chip, the voltage reduction circuit being electrically inserted between the first power supply pad and a power source voltage supplying portion of the CMOS circuit part, the voltage reduction circuit reducing the power source voltage in accordance with the control signal thereby to obtain a reduced power source voltage and outputting the reduced power source voltage to the power source voltage supplying portion of the CMOS circuit part; and a second power supply pad mounted on the semiconductor chip, the second power supply pad being electrically inserted between a power source voltage supplying portion of the bipolar circuit part and the external power source terminal.

Thus, in the present invention, at least one voltage reduction circuit is provided between the first power supply pad and the power source supply of the CMOS circuit part or between the second power supply pad and the power source supply of the bipolar circuit part. The voltage reduction circuit reduces the power source voltage in accordance with the control signal to produce the reduced power source voltage. The reduced power source voltage thus produced is given to the power source supply of the CMOS circuit part or the bipolar circuit part to which the voltage reduction circuit is connected. Hence, even though the same power source voltage is commonly supplied to the first and the second power supply pads via the same external power source terminal, it is possible to give the power source voltage to the CMOS circuit part while giving the reduced power source voltage to the bipolar circuit part or vice versa.

Accordingly, the object of the present invention is to obtain a Bi-CMOS semiconductor integrated circuit device in which power source voltages given to the CMOS circuit part and the bipolar circuit part are different without increasing the number of external power source pins.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
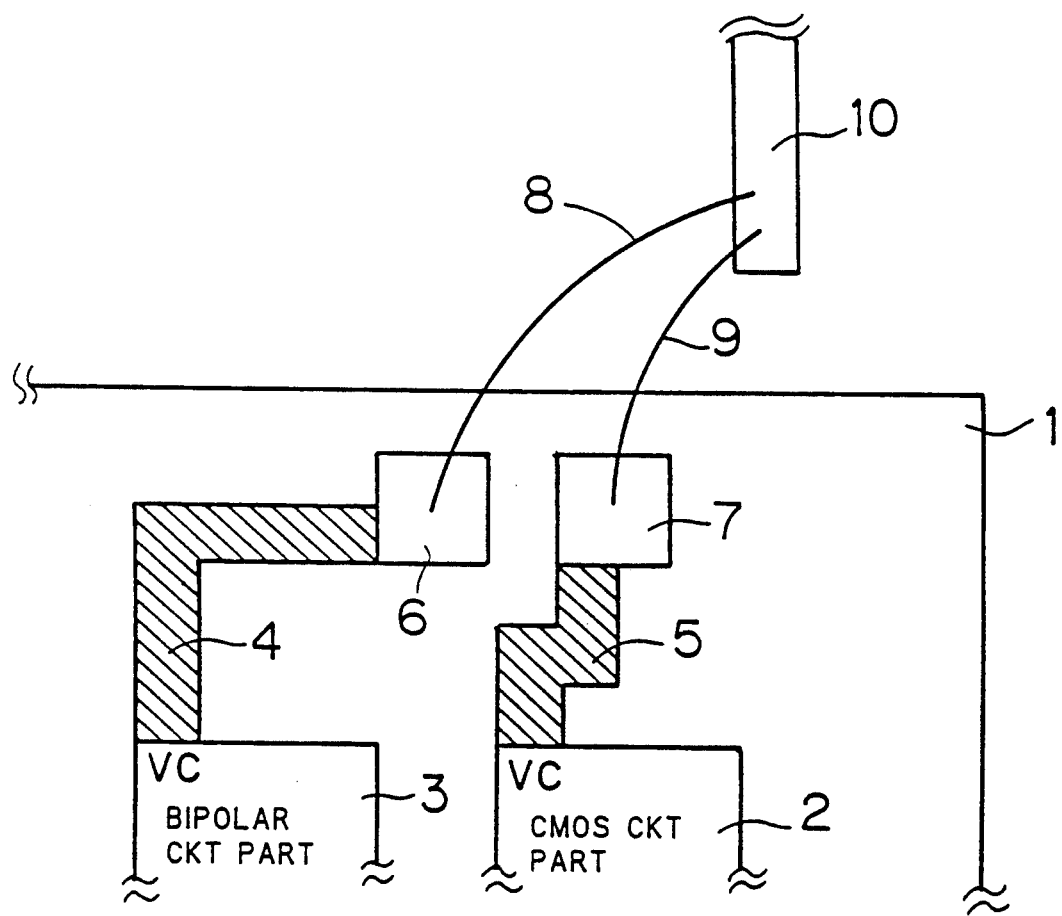
FIG. 1 is an explanatory diagram showing a structure of a conventional Bi-CMOS semiconductor integrated circuit device.
Figure 2:
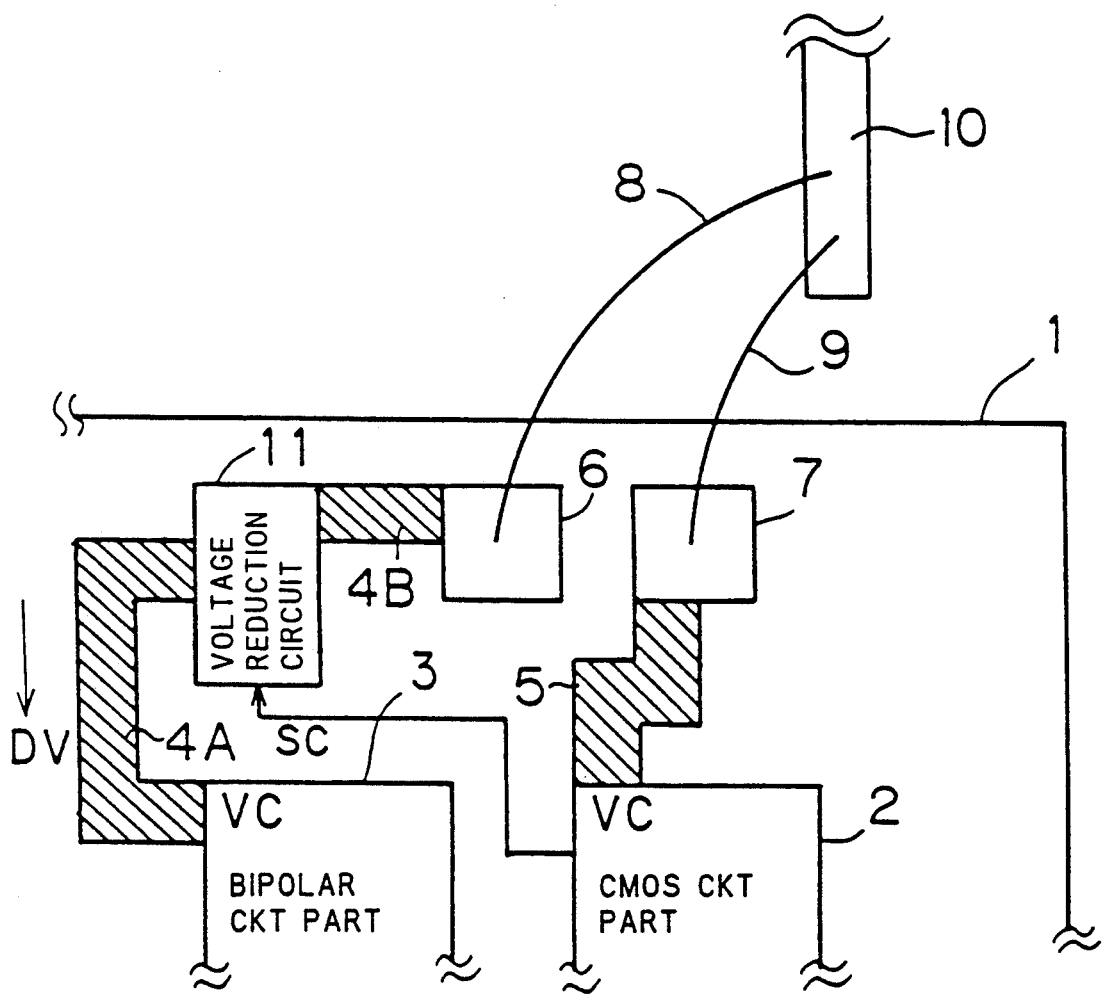
FIG. 2 is an explanatory diagram of a Bi-CMOS semiconductor integrated circuit device according to a preferred embodiment of the present invention.

FIG. 2 is an explanatory diagram showing the structure of a Bi-CMOS semiconductor integrated circuit device according to a preferred embodiment of the present invention. As shown in FIG. 2, the Bi-MOS semiconductor device includes a voltage reduction circuit 11 which is interposed between a power source voltage supplying portion VC of a bipolar circuit part 3 and a power supply pad 6. Electrical connection between the voltage reduction circuit 11 and the power source voltage supplying portion VC of the bipolar circuit part 3 is ensured by a power supply line 4A. Likewise, electrical connection between the voltage reduction circuit 11 and the power supply pad 6 is ensured by a power supply line 4B. Driven by a reduced voltage circuit control signal SC from a CMOS circuit part 2, the voltage reduction circuit 11 reduces a power source voltage received through an external power source voltage pin 10 and the power supply pad 6, and gives a reduced voltage DV to the power source voltage supplying portion VC of the bipolar circuit part 3. The Bi-CMOS semiconductor device is otherwise similar to the conventional Bi-MOS semiconductor device of FIG. 1, and therefore, further explanation regarding structure will be simply omitted.

Figure 3:
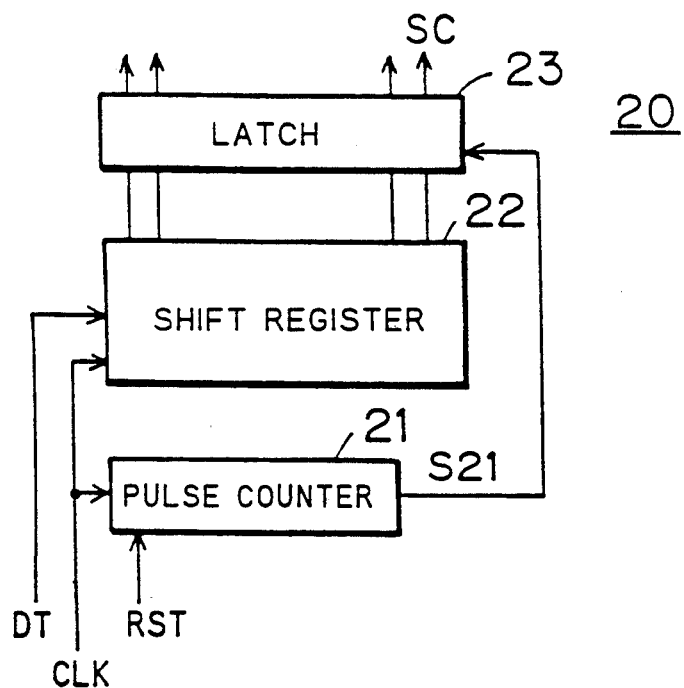
FIG. 3 is a circuitry diagram showing a first structure of a control signal generation part for generating a voltage reduction circuit control signal mounted in a CMOS circuit part of FIG. 2.

FIG. 3 is a block diagram showing a first structure of a control signal generation part for generating a control signal SC. As shown in FIG. 3, the control signal generation part 20 is mounted within the CMOS circuit part 2, and includes a pulse counter 21, a shift register 22 and a latch 23.

The pulse counter 21 is driven by a clock signal CLK and a reset signal RST. The pulse counter 21 counts pulses of the clock signal CLK. On counting the pulses of the clock signal CLK has been counted for predetermined times, i.e., when a predetermined pulse count value has been reached, the pulse counter 21 outputs a count output signal S21 of an active state to the latch 23. The pulse count value is reset when the pulse counter 21 receives the reset signal RST of an active state.

The shift register 22 is driven by the clock signal CLK and a data signal DT. In synchronism with the clock signal CLK, the shift register 22 shifts data which has been preliminarily stored therein while serially accepting the data signals DT. The data signals DT are stored in the shift register 22 as stored data having preselected bits.

The latch 23 stores the stored data of the shift register 22 as latch data when the count output signal S21 it received is active. On the other hand, when the count output signal S21 is not active, the latch 23 does not store the stored data of the shift register 22. Instead, the latch 23 maintains latch data which has been stored therein in advance. Predetermined one-bit data of the latch data thus stored in the latch 23 is outputted from the CMOS circuit part 2 as a control signal SC. The remaining information of the latch data is outputted to other internal circuit as regular data used within the CMOS circuit part 2.

With such structure, after the reset signal RST of the active state has triggered the pulse counter 21 to initialize a pulse count value, the reset signal RST is inactivated.

Thereafter, the data signals DT are serially provided to the shift register 22 in synchronism with the clock signal CLK, whereby data including information about the control signal SC is stored in the shift register 22 as the stored data.

Following this, the pulse counter 21 counts the pulses of the clock signal CLK up to a predetermined pulse count value. When the predetermined pulse count value has been reached, that is, when it is confirmed that the stored data has been stored in the shift register 22, the pulse counter 21 gives the count output signal S21 of the active state to the latch 23 to transmit the stored data in the shift register 22 to the latch 23. Thereafter, latch data representing a selected one-bit information is outputted as the control signal SC.

Thus, the latch data is fixed once data transmission to the latch 23 is complete, allowing that the CMOS circuit part 2 keeps releasing the control signal SC which has a certain constant value. In other words, until the pulse counter 21 resets a pulse count value in response to the active reset signal RST received therein and the pulse counter 21 has counted the pulses of the clock signal CLK up to the predetermined pulse count value, the latch data in the latch 23 will not be updated, which means that the control signal SC maintains a certain constant value.

Figure 4:
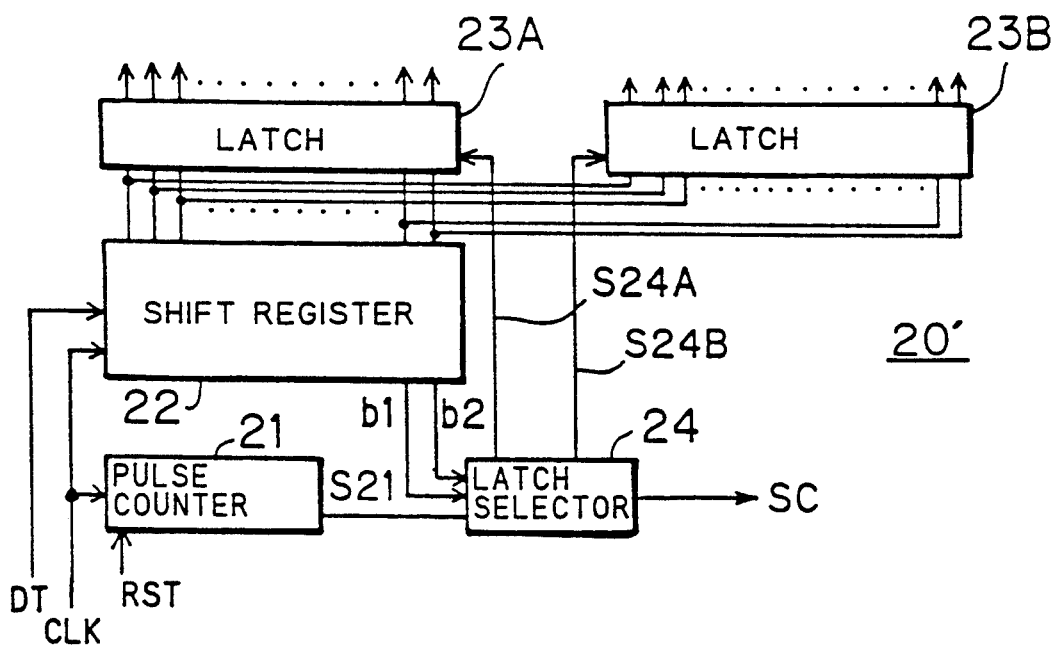
FIG. 4 is a circuitry diagram showing a second structure of a control signal generation part for generating a voltage reduction circuit control signal mounted in a CMOS circuit part of FIG. 2.

FIG. 4 is a block diagram showing a second structure of the control signal generation part of the CMOS circuit part 2. As shown in FIG. 4, a control signal generation part 20' comprises a pulse counter 21, a shift register 22, a latches 23A and 23B and a latch selector 24.

In response to a clock signal CLK and a reset signal RST received therein, the pulse counter 21 counts the pulses of the clock signal CLK. Only when the pulses of the clock signal CLK has been counted for predetermined times, the pulse counter 21 outputs an active count output signal S21 to the latch selector 24. The pulse counter 21 otherwise outputs an inactive count output signal S21 to the latch selector 24. Receiving the reset signal RST of the active state, the pulse counter 21 resets the counted value of the pulses.

The shift register 22 is driven by the clock signal CLK and a data signal DT. In synchronism with the clock signal CLK, the shift register 22 shifts data which has been preliminarily stored therein while serially accepting the data signals DT. The data signals DT are stored in the shift register 22 as stored data having preselected bits.

The latch selector 24 receives the count output signal S21. The latch selector 24 also receives two-bit data of the stored data stored in the shift register 22, one-bit data as first bit-related information b1 and the other one-bit data as second bit-related information b2.

In response to the first bit-related information b1, the latch selector 24 outputs a voltage reduction circuit control signal SC of a high level or a low level. In response to the second bit-related information b2, the latch selector 24 outputs select signals S24A and S24B to the latches 23A and 23B, respectively. Of the two select signals S24A and S24B, one is outputted as an active signal while the other is outputted as an inactive signal.

If the select signal S24A received therein is active, the latch 23A stores the stored data of the shift register 22 as latch data. On the other hand, if the select signal S24A is inactive, the latch 23A maintains latch data stored therein in advance in stead of storing the stored data from the shift register 22. Likewise, the latch 23B stores the stored data of the shift register 22 as latch data if the select signal S24B is active, but maintains latch data stored therein in advance in stead of storing the stored data of the shift register 22 if the select signal S24B is inactive. The latch data stored within the latches 23A and 23B is outputted as data used within the CMOS circuit part 2.

In the control signal generation part having such structure, a pulse count value is initialized by preliminarily driving the pulse counter 21 with the active reset signal RST, followed by that the reset signal RST is inactivated.

Then, the data signals DT are serially provided to the shift register 22 in synchronism with the clock signal CLK, whereby data including latch select information and information about the control signal SC is stored in the shift register 22 as the stored data.

Thereafter, the pulse counter 21 counts the pulses of the clock signal CLK up to predetermined times, thereby confirming that the stored data has been stored in the shift register 22. In response to this, the pulse counter 21 provides the latch selector 24 with the active count output signal S21. As a result, data representing bit-related information about selected two bits stored in the shift register 22 is outputted to the latch selector 24. Out of the two-bit data, one-bit data, i.e., information about the voltage reduction circuit control signal SC, is outputted as the first bit-related information b1. The other one-bit data, i.e., the latch select information, is outputted as the second bit-related information b2. At the same time, remaining information of the stored data stored in the shift register 22 is outputted the latches 23A and 23B.

On receipt of the first bit-related information b1 (information about the voltage reduction circuit control signal SC), the latch 24 outputs control signal SC. The latch 24 also outputs the select signals S24A and S24B to the latches 23A and 23B, respectively, in response to the second bit-related information b2 (latch select information), the select signal S24A being active while the select signal S24B being inactive or vice versa.

Either one of the latches 23A and 23B which has received the active select signal S24A or S24B latches the stored data of the shift register 22 as the latch data. However, the bit-related information b1 and b2 remains unlatched.

Thus, once the first bit-related information b1 which represents information about the control signal SC has been transmitted to the latch selector 24, the control signal SC maintains a certain constant value. That is, until the pulse counter 21 resets a pulse count value in response to the active reset signal RST received therein and the pulse counter 21 has counted the pulses of the clock signal CLK up to the predetermined times once again and has outputted the count output signal S21 of the active state to the latch selector 24, the value of the control signal SC from the latch selector 24 remains unchanged.

Figure 5:
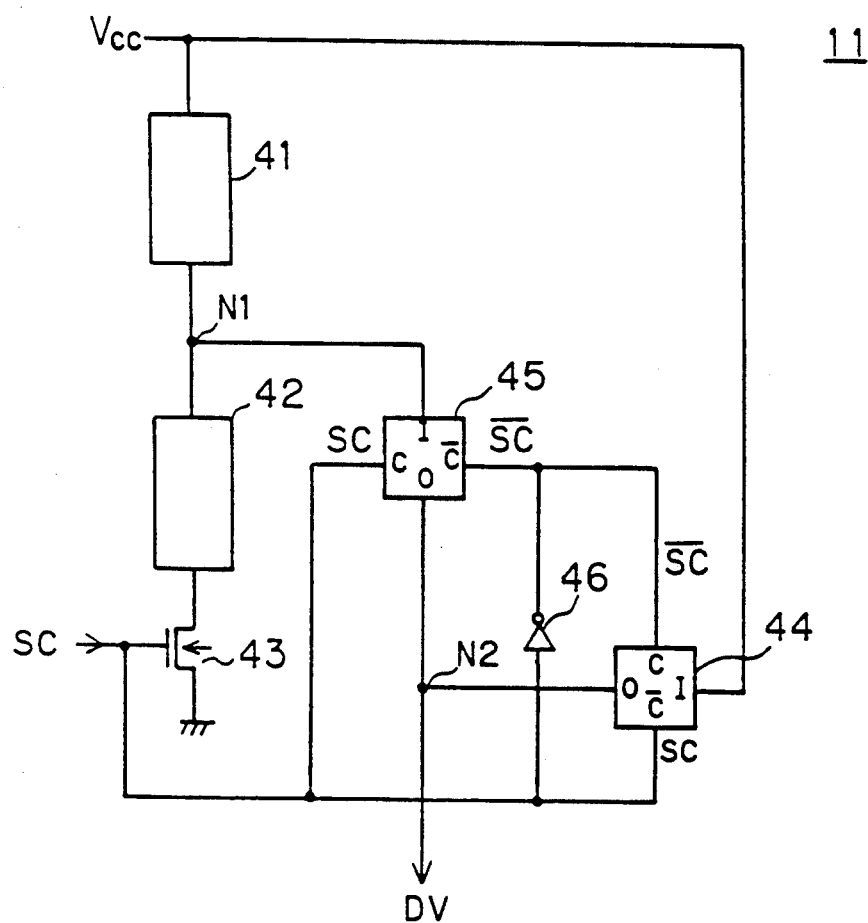
FIG. 5 is a circuitry diagram showing a first structure of a voltage reduction circuit of FIG. 2.

FIG. 5 is a circuitry diagram of a first structure of the voltage reduction circuit 11 of the Bi-CMOS semiconductor integrated circuit device (FIG. 2). In FIG. 5, resistors 41 and 42 and an N-channel transistor 43 are inserted in series between a power source and a ground.

The power source is connected to an input part I of a transfer gate 44. An node N1 between the resistors 41 and 42 is connected to an input part I of a transfer gate 45. An output part O of the transfer gate 44 and an output part O of the transfer gate 45 are commonly connected to an node N2 a voltage obtained at which is given to the power source voltage supply VC of the bipolar circuit part 3 as a reduced power source voltage DV from the voltage reduction circuit 11.

On the other hand, the control signal SC from the CMOS circuit part 2 is given to a gate of the transistor 43, an inverse control part $\overline{C}$ of the transfer gate 44 and a control part C of the transfer gate 45, thereby causing an inverter 46 to invert the control signal SC into an inverse control signal $\overline{SC}$. The inverse control signal $\overline{SC}$ is given to a control part C of the transfer gate 44 and an inverse control part $\overline{C}$ of the transfer gate 45.

The transfer gates 44 and 45 gate a signal in the following manner. In response to a high level signal received at the control part C or a low level signal received at the inverse control part $\overline{C}$, the transfer gate outputs at the output part O a signal as obtained at the input part I. On the other hand, when supplied with a low level signal at the control part C or with a high level signal at the inverse control part $\overline{C}$, the transfer gate turns off. In off-state operations, the transfer gates 44 and 45 interrupt a signal obtained at their input parts I and bring their output parts O into floating state.

With such structure, the voltage reduction circuit 11 of FIG. 5 allows the followings. Receiving the high level control signal SC from the CMOS circuit part 2, the transistor 43 and the transfer gate 45 turn on and the transfer gate 44 turns off. Hence, a power source voltage $V_{CC}$ is divided by the resistors 41 and 42, thereby a potential V1 resulting at the node N1. The voltage having the potential V1 thus obtained serves as the reduced power source voltage DV generated by the voltage reduction circuit 11.

On the contrary, the transistor 43 and the transfer gate 45 turn off and the transfer gate 44 turns on when the control signal SC to the voltage reduction circuit 11 from the CMOS circuit part 2 has the low potential level. In this case, the power source voltage $V_{CC}$ as received by the voltage reduction circuit 11 serves as the reduced power source voltage DV; that is, voltage reduction level of the power source voltage $V_{CC}$ is zero. In addition, since the transistor 43 is turned off, excessive current flow through the resistors 41 and 42 and the transistor 43 would not result between the power source and the ground.

Thus, the voltage reduction circuit 11 of FIG. 5 provides the bipolar circuit part 3 with the power source voltage $V_{CC}$ or the voltage V1 which has a lower potential level than the power source voltage $V_{CC}$ as the reduced power source voltage DV. As heretofore described, the resistors 41 and 42 are used in this particular preferred embodiment. However, diodes can be used instead.

Figure 6:
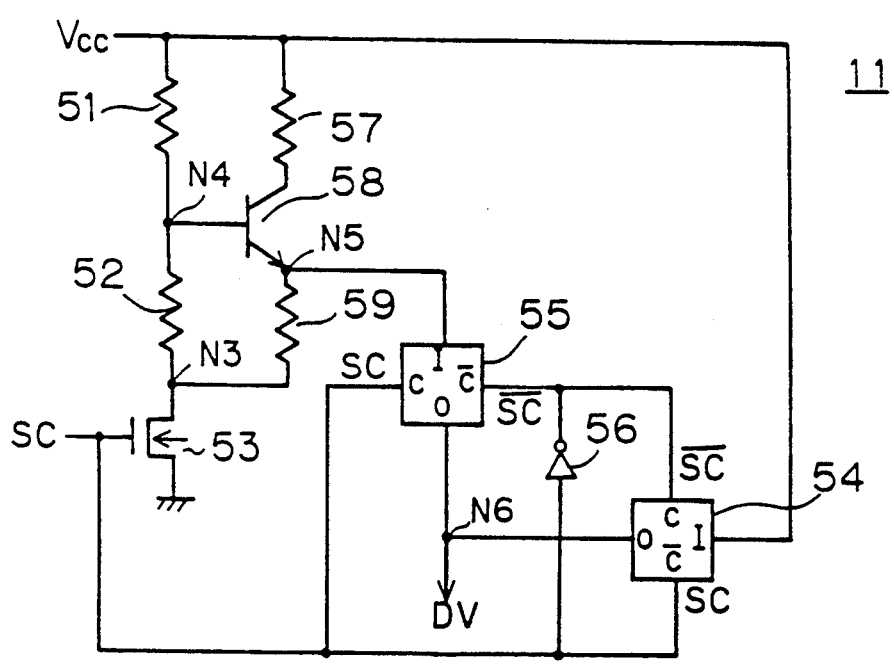
FIG. 6 is a circuitry diagram showing a second structure of a voltage reduction circuit of FIG. 2.

FIG. 6 is a circuitry diagram of a second structure of the voltage reduction circuit 11 of the Bi-CMOS semiconductor integrated circuit device of FIG. 2. In FIG. 6, resistors 51 and 52 and an N-channel transistor 53 are inserted in series between a power source and a ground. A resistor 57, an NPN bipolar transistor 58 and a resistor 59 are connected in series between the power source and an node N3 between the resistor 52 and the transistor 53 so as to be parallel to the resistors 51 and 52. A gate of the transistor 58 is connected to an node N4 between the resistors 51 and 52.

The power source is connected to an input part I of a transfer gate 54. An node N5 between an emitter of the transistor 58 and the resistor 59 is connected to an input part I of a transfer gate 55. An output part O of the transfer gate 54 and an output part O of the transfer gate 55 are connected in common to an node N6. A voltage obtained at the node N6 is given to the power source voltage supply VC of the bipolar circuit part 3 as the reduced power source voltage DV from the voltage reduction circuit 11.

On the other hand, the control signal SC from the CMOS circuit part 2 is given to a gate of the transistor 53, an inverse control part $\overline{C}$ of the transfer gate 54 and a control part C of the transfer gate 55, thereby causing an inverter 56 to invert the control signal SC into an inverse control signal $\overline{SC}$. The inverse control signal $\overline{SC}$ thus generated is given to a control part C of the transfer gate 54 and a control part C of the transfer gate 55.

The transfer gates 54 and 55 gate a signal in the following manner. When a high level signal is received at the control part C or a low level signal is received at the inverse control part $\overline{C}$, the transfer gate outputs at its output part O a signal as obtained at the input part I. On the other hand, when a low level signal is given to the control part C or a high level signal is given to the inverse control part $\overline{C}$, the transfer gate turns off. In off-state operations, the transfer gates 44 and 45 interrupt a signal obtained at their input parts I and bring their output parts O into floating state.

In the voltage reduction circuit 11 with such structure (FIG. 6), the transistor 53 and the transfer gate 55 turn on and the transfer gate 54 turns off in response to the high level control signal SC received from the CMOS circuit part 2. As a result, a voltage having a potential V5 obtained at the node N5, or the emitter of the transistor 58 serves as the reduced power source voltage DV generated by the voltage reduction circuit 11.

The voltage having the potential V5 thus obtained at the node N5 is $$V5 = V_{CC} * R1/(R1+R2) - V_{BE}$$

where $V_{BE}$ is an emitter-base voltage at the bipolar transistor 58, and R1 and R2 are resistances of the resistors 51 and 52, respectively. Thus, the potential V5 is lower than the potential level of the power source voltage $V_{CC}$.

Opposite to the above, if the control signal SC to the voltage reduction circuit 11 from the CMOS circuit part 2 is at the low level, the transistor 53 and the transfer gate 55 turn off and the transfer gate 54 turns on, thereby allowing that the power source voltage $V_{CC}$ as received by the voltage reduction circuit 11 serves as the reduced power source voltage DV. In other words, voltage reduction level of the power source voltage VCC is zero. Further, since the transistor 53 is turned off, unnecessary excessive current flow through the resistors 51 and 52 and the transistor 53 would not result between the power source and the ground.

Thus, the voltage reduction circuit 11 of FIG. 6 provides the bipolar circuit part 3 with the power source voltage $V_{CC}$ or the voltage V5 which has a lower potential level than the power source voltage $V_{CC}$ as the reduced power source voltage DV.

In recapitulation, the reduced voltage circuits 11 employed in the respective semiconductor integrated circuit devices according to the preferred embodiments (FIGS. 2 to 6) are under control of the conventional data signal DT which is given to the CMOS circuit part 2. Hence, it is possible in the present invention to selectively change the potential level of the reduced power source voltage DV which is to be given to the power source voltage supply VC of the bipolar circuit part 3; precisely, from the regular power source level $V_{CC}$ to a level lower than the same or vice versa.

For example, an optimum burn-in test is achievable in which the bipolar circuit part 3 is energized with a power source voltage of around 5 volts and the CMOS circuit part 2 is energized with a power source voltage of around 7 volts. To this end, the voltage reduction circuit 11 is structured so that the reduced power source voltage DV therefrom has a potential level 5/7 that of the power source voltage $V_{CC}$. A power source voltage to the external power source voltage pin 10 is 7 volts. The data signal DT to be given to the control signal generating part of the CMOS circuit part 2 is such a signal that drives the CMOS circuit part 2 to output the high level control signal SC. Hence, a voltage of 7 volts to the pin 10 and the data signal DT as above to the CMOS circuit part 2 result in that a power source voltage of 7 volts is supplied to the power source voltage supply VC of the CMOS circuit part 2 and the reduced power source voltage DV of around 5 volts is given to the power source voltage supply VC of the bipolar circuit part 3. Thus, the present invention promises that a burn-in test is extremely time- and labor-saving as compared to a conventional burn-in test.

As heretofore described, the Bi-CMOS semiconductor integrated circuit devices according to the preferred embodiments of the present invention have the following meritorious effects. First, different power source voltages to the CMOS circuit part 2 and the bipolar circuit part 3 are possible without changing the conventional Bi-CMOS structure in which the power source voltage $V_{CC}$ is commonly given to the power supply pads 7 and 6 of the CMOS circuit part 2 and the bipolar circuit part 3, respectively, through the external power source voltage pin 10. Second, the present invention does not require an additional external terminal for determining a value of the voltage reduction circuit control signal SC according to which the reduction voltage circuit 11 generates the reduced power source voltage DV. This is because the value of the control signal SC is determined using the data signal DT which is used within the CMOS circuit part 2.

Needless to say, it is possible that a common power source voltage drives the CMOS circuit part 2 and the bipolar circuit part 3 as customarily practiced in the art by allowing the voltage reduction circuit 11 to output the power source voltage $V_{CC}$ per se as the reduction power source voltage.

Figure 7:
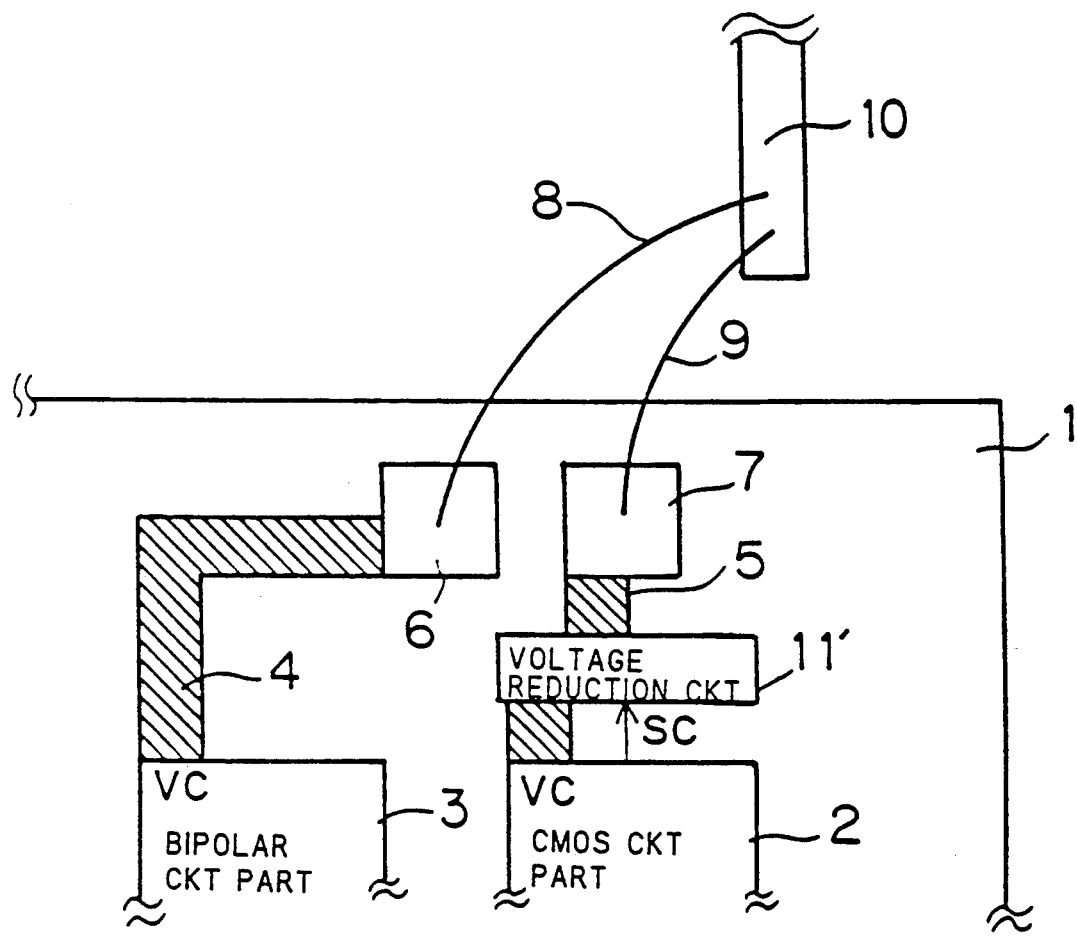
FIG. 7 is an explanatory diagram of a Bi-CMOS semiconductor integrated circuit device according to another preferred embodiment of the present invention.

Although required in the foregoing preferred embodiments to be connected to the bipolar circuit part 3, the voltage reduction circuit 11 may be connected to the CMOS circuit part 2 as a voltage reduction circuit 11' is in FIG. 7. In this case, the CMOS circuit part 2 can be driven with a power source voltage lower than that to be given to the bipolar circuit part 3. Of course, the CMOS circuit part 2 and the bipolar circuit part 3 may each comprise a voltage reduction circuit.

The description heretofore has described the voltage reduction circuit 11 as outputting in response to the voltage reduction circuit control signal SC either the power source voltage or a voltage lower than the same as the reduced power source voltage. However, this is not intended to prohibit variations and modifications. For instance, the voltage reduction circuit 11 may be structured so that it selects and outputs one of a plurality of low voltages generated therein as the reduced power source voltage.

While the invention has been shown and described in detail, the foregoing description is in all aspects illustrative and not restrictive. It is understood that numerous modifications and variations can be devised without departing from the scope of the invention.

I claim

1. A semiconductor integrated circuit device, comprising:
    a semiconductor chip;
    a CMOS circuit part formed by CMOS elements which are provided on said semiconductor chip, said CMOS circuit part including a control signal generation part for outputting a control signal in response to a data signal supplied thereto;
    a bipolar circuit part formed by bipolar elements which are provided on said semiconductor chip;
    an external power source terminal for receiving a predetermined power source voltage;
    a first power supply pad mounted on said semiconductor chip, said first power supply pad being electrically interposed between a power source voltage supplying portion of said CMOS circuit part and said external power source terminal;
    a second power supply pad mounted on said semiconductor chip, said second power supply pad being electrically interposed between a power source voltage supplying portion of said bipolar circuit part and said external power source terminal; and
    at least one voltage reduction circuit being inserted at least between said first power supply pad and said power source voltage supplying portion of said CMOS circuit part or between said second power supply pad and said power source voltage supplying portion of said bipolar circuit part, said at least one voltage reduction circuit reducing said power source voltage in accordance with said control signal thereby to obtain a reduced power source voltage and outputting said reduced power source voltage to said power source voltage supplying portion of said CMOS and/or bipolar circuit part to which said at least one voltage reduction circuit is connected.

2. A semiconductor integrated circuit device of claim 1, wherein said voltage reduction circuit, in response to said control signal, reduces said power source voltage by a predetermined amount or does not reduce said power source voltage at all, thereby to produce said reduced power source voltage.

3. A semiconductor integrated circuit device of claim 1, wherein said voltage reduction circuit, in response to said control signal, reduces said power source voltage by predetermined amounts so that resulting voltages have varying potential levels and one of said resulting voltages of varying potential levels is selected as said reduced power source voltage.

4. A semiconductor integrated circuit device of claim 2, wherein said control signal generation part of said CMOS circuit part further includes:
    a shift register driven by a clock signal and said data signal, said shift register shifting said data signal one after another in synchronism with said clock signal received thereto, whereby said data signal is stored in said shift register as stored data;
    a pulse counter, said pulse counter counting pulses of said clock signal and outputting an active count output signal only when the pulses of said clock signal has been counted for predetermined times; and
    a latch driven by said count output signal in accordance with said stored data of said shift register, said latch latching said stored data as latch data when said count output signal is active and outputting a portion of said latch data as said control signal.

5. A semiconductor integrated circuit device of claim 4, wherein a remaining portion of said latch except for said portion outputted as said control signal is used within said CMOS circuit part.

6. A semiconductor integrated circuit device of claim 2, wherein said control signal generation part of said CMOS circuit part further includes:
    a shift register driven by a clock signal and said data signal, said shift register shifting said data signal one after another in synchronism with said clock signal received thereto, whereby said data signal is stored in said shift register as stored data;
    a pulse counter, said pulse counter counting pulses of said clock signal and outputting an active count output signal only when the pulses of said clock signal has been counted for predetermined times;
    a latch selector driven by said count output signal in accordance with first data and second data, said first and said second data each being a portion of said stored data of said shift register, said latch selector latching said first and said second data as latch data when said count output signal is active and outputting said first data as said control signal while outputting a plurality of latch selection signals in accordance with said second data, said plurality of latch selection signals including an active latch selection signal and an inactive latch selection signal; and a plurality of latches each receiving a portion of said remaining portion of said stored data and either one of said active latch selection signal and said inactive latch selection signal, said plurality of latches each latching said portion of said stored data received therein as latch data when receiving said active latch selection signal.

7. A semiconductor integrated circuit device of claim 6, wherein said latch data in each one of said plurality of latches is used within said CMOS circuit part.

8. A semiconductor integrated circuit device of claim 2, wherein said voltage reduction circuit further includes:

voltage reduction means for reducing said power source voltage and outputting a low level power source voltage; and output voltage selection means, said output voltage selection means, in response to said control signal, outputting either one of said power source voltage and said low level power source voltage as said reduced power source voltage.

9. A semiconductor integrated circuit device of claim 8, wherein said voltage reduction means includes a plurality of resistors which are provided in series between a power source and a ground, and said plurality of resistors divide said power source voltage, whereby said low level power source is produced and outputted.

10. A semiconductor integrated circuit device of claim 9, wherein said voltage reduction means further includes a transistor which turns off in response to said control signal received at a gate thereof, thereby said low level power source voltage being prevented from being outputted.

11. A semiconductor integrated circuit device of claim 9, wherein said voltage reduction means causing voltage drop at a diode provided between said power source and said ground and reducing said power source voltage, thereby producing and outputting said low level power source voltage.

12. A semiconductor integrated circuit device of claim 9, wherein said voltage reduction means causing voltage drop at a transistor provided between said power source and said ground and reducing said power source voltage, thereby producing and outputting said low level power source voltage.

13. A semiconductor integrated circuit device, comprising:

a semiconductor chip;

a CMOS circuit part formed by CMOS elements which are provided on said semiconductor chip, said CMOS circuit part including a control signal generation part for outputting a control signal in response to a data signal supplied thereto;

a bipolar circuit part formed by bipolar elements which are provided on said semiconductor chip;

an external power source terminal for receiving a predetermined power source voltage;

a first power supply pad mounted on said semiconductor chip, said first power supply pad being electrically connected to said external power source terminal;

a voltage reduction circuit mounted on said semiconductor chip, said voltage reduction circuit being electrically inserted between said first power supply pad and a power source voltage supplying portion of said bipolar circuit part, said voltage reduction circuit reducing said power source voltage in accordance with said control signal thereby to obtain a reduced power source voltage and outputting said reduced power source voltage to said power source voltage supplying portion of said bipolar circuit part; and a second power supply pad mounted on said semiconductor chip, said second power supply pad being electrically inserted between a power source voltage supplying portion of said CMOS circuit part and said external power source terminal.

14. A semiconductor integrated circuit device, comprising:

a semiconductor chip;

a CMOS circuit part formed by CMOS elements which are provided on said semiconductor chip, said CMOS circuit part including a control signal generation part for outputting a control signal in response to a data signal supplied thereto;

a bipolar circuit part formed by bipolar elements which are provided on said semiconductor chip;

an external power source terminal for receiving a predetermined power source voltage;

a first power supply pad mounted on said semiconductor chip, said first power supply pad being electrically connected to said external power source terminal;

a voltage reduction circuit mounted on said semiconductor chip, said voltage reduction circuit being electrically inserted between said first power supply pad and a power source voltage supplying portion of said CMOS circuit part, said voltage reduction circuit reducing said power source voltage in accordance with said control signal thereby to obtain a reduced power source voltage and outputting said reduced power source voltage to said power source voltage supplying portion of said CMOS circuit part; and a second power supply pad mounted on said semiconductor chip, said second power supply pad being electrically inserted between a power source voltage supplying portion of said bipolar circuit part and said external power source terminal.

* * * * *